US007132361B2

(12) United States Patent
Brody et al.

(10) Patent No.: US 7,132,361 B2
(45) Date of Patent: Nov. 7, 2006

(54) SYSTEM FOR AND METHOD OF FORMING VIA HOLES BY MULTIPLE DEPOSITION EVENTS IN A CONTINUOUS INLINE SHADOW MASK DEPOSITION PROCESS

(75) Inventors: Thomas P. Brody, Pittsburgh, PA (US); Joseph A. Marcanio, Latrobe, PA (US); Jeffrey W. Conrad, Verona, PA (US); Timothy A. Cowen, Lower Burrell, PA (US)

(73) Assignee: Advantech Global, Ltd, Tortola (VG)

( * ) Notice: Subject to any disclaimer, the term of this patent is extended or adjusted under 35 U.S.C. 154(b) by 33 days.

(21) Appl. No.: 11/020,907

(22) Filed: Dec. 23, 2004

(65) Prior Publication Data
US 2006/0141761 A1   Jun. 29, 2006

(51) Int. Cl.
*H01L 21/4763* (2006.01)
(52) U.S. Cl. ............... 438/622; 438/618; 438/944; 438/945; 257/E21.023
(58) Field of Classification Search ............... 438/622, 438/618, 944, 945
See application file for complete search history.

(56) References Cited

U.S. PATENT DOCUMENTS 4,853,345 A   8/1989 Himelick

| 6,946,783 | B1* | 9/2005 | Kim | 313/402 |
|---|---|---|---|---|
| 2001/0053586 | A1 | 12/2001 | Lee et al. | |
| 2003/0193285 | A1 | 10/2003 | Kim | |
| 2003/0218254 | A1 | 11/2003 | Kurimoto et al. | |
| 2004/0003775 | A1* | 1/2004 | Kim | 118/504 |
| 2004/0137719 | A1 | 7/2004 | Jin | |
| 2006/0024444 | A1* | 2/2006 | Brody | 427/282 |

FOREIGN PATENT DOCUMENTS

JP   06104206   *  4/1994

* cited by examiner

*Primary Examiner*—Michael Trinh
*Assistant Examiner*—Christy Novacek
(74) *Attorney, Agent, or Firm*—The Webb Law Firm

(57) ABSTRACT

Via holes are formed in a continuous inline shadow mask production system by depositing a first conductor layer and subsequently depositing a first insulator layer over a portion of the first conductor layer. The first insulator layer is deposited in a manner to define at least one notch along its edge. The second insulator layer is then deposited on another portion of the first conductor layer in a manner whereupon the second insulator layer slightly overlaps each notch of the first insulator layer, thereby forming the one or more via holes. A conductive filler can optionally be deposited in each via hole. Lastly, a second conductive layer can be deposited over the first insulator layer, the second insulator layer and, if provided, the conductive filler.

12 Claims, 8 Drawing Sheets

SYSTEM FOR AND METHOD OF FORMING VIA HOLES BY MULTIPLE DEPOSITION EVENTS IN A CONTINUOUS INLINE SHADOW MASK DEPOSITION PROCESS

BACKGROUND OF THE INVENTION

1. Field of the Invention

The present invention relates to a shadow mask deposition system and method for forming electronic elements on a substrate and, more particularly, to forming via holes in a shadow mask deposition process.

2. Description of Related Art

Generally, in a multi-layer electronic device, such as a semiconductor device, a via is needed to provide a conductive path through a non-conductive layer (insulator or dielectric layer), in order to connect two or more conducting layers. A via is a structure formed by filling or lining a via hole (or through-hole) with conductive material, which is used to electrically connect two or more conducting layers in a multi-layer substrate.

The creation of vias in typical microcircuit fabrication processes is accomplished by applying a pattern or stencil of etch resistant material over the layer through which the via is to be formed and subsequently applying an etching medium to the wafer to remove areas unprotected by the etch resistant material. The etch resistant material, known as photoresist, is patterned by a process called photolithography, which is a subtractive wet chemical process.

Because photolithography is a subtractive process, it is a process that lends well to the formation of via holes in the manufacture of multi-layer electrical devices. The multi-layer electrical device fabrication process includes numerous deposition and etching steps in order to define appropriate patterns of conductors, insulators and vias. Exemplary photolithography processing steps that produce vias in a multi-layer electrical device include: applying a photoresist pattern of via holes upon an insulator layer; developing the image whereupon photoresist remains everywhere except at the via locations; baking the image; etching the structure whereupon the etching material dissolves the insulator layer but not the photoresist, thereby forming a hole in the insulator layer in the areas where there is no photoresist without damaging an underlying conductor; and removing the remaining photoresist which leaves the insulation layer (with via holes therethrough) on top of the underlying conductor. As can be seen, the multi-layer electrical device fabrication process utilizes numerous deposition and etching steps in order to define one or more appropriate patterns, especially vias.

Because of the number of steps required to form multi-layer electronic devices, such as semiconductor devices, with the photolithographic manufacturing process, foundries of adequate capacity for volume production are very expensive. Furthermore, because of the nature of the fabrication process, the production equipment must be utilized in a class one or class ten clean room. In addition, because of the amount of equipment needed and the size of each piece of equipment, the clean room must have a relatively large area, which can be relatively expensive.

A vapor deposition shadow mask process is well known and has been used for years in microelectronics manufacturing. The vapor deposition shadow mask process is a significantly less costly and less complex manufacturing process compared to the photolithography process. However, in contrast to the photolithography manufacturing process, the vapor deposition shadow mask process is an additive process that is performed in a vacuum environment. In order to form a pattern by shadow mask vacuum deposition, an opening (aperture) is required in the mask to allow material to pass therethrough. However, to make a non-deposit area (such as a via hole), a blockage is needed in the mask to block the area from material being deposited thereon. Therefore, in order to make a via hole, a land mass in the form of an unconnected island is needed to block the via location. This is not possible with a shadow mask because there would be no material to support the blocked area.

Furthermore, a continuous inline, reel-to-reel shadow mask deposition process, which is an additive process, presents a technical challenge in making via holes without disrupting the process. For example, it is inefficient and impractical to insert one or more photolithography steps into a highly efficient inline, reel-to-reel shadow mask deposition process.

Therefore, what is needed, and not disclosed in the prior art, is a method and apparatus for forming a via hole in an automated shadow mask vacuum deposition process.

SUMMARY OF THE INVENTION

The invention is a shadow mask vapor deposition method that comprises (a) vapor depositing a first conductor layer on a substrate; (b) separately vapor depositing a pair of insulator layers on the first conductor layer, wherein one of the pair of deposited insulator layers defines a slot along an edge thereof and the combination of the slot and an edge of the other of the pair of deposited insulator layers define a via hole; and (c) vapor depositing a second conductor layer on the first and second insulators, wherein the first and second conductors layers are electrically connected by way of an electrical conductor in the via hole.

The second conductor layer can form the electrical conductor. Alternatively, between steps (b) and (c), the method can further include vapor depositing the electrical conductor in the via hole.

Each conductor layer and each insulator layer can be deposited by way of a different shadow mask. Alternatively, each conductor layer can be deposited by way of a different shadow mask and each insulator layer can be deposited by way of the same shadow mask that is repositioned between depositions of one of the pair of insulator layers and the other of the pair of insulator layers.

Before vapor depositing each layer, the substrate can be advanced into operative relation with the corresponding shadow mask. The first and second conductor layer can be formed from the same conductive material. The first and second insulator layer can be formed from the same insulating material.

The invention is also a shadow mask vapor deposition method that comprises (a) vapor depositing a first conductor on a substrate; (b) vapor depositing a first insulator on the first conductor; (c) vapor depositing a second insulator on the first conductor, whereupon at least one via hole is defined solely by the vapor depositions of said first and second insulators; and (d) vapor depositing a second conductor on the first and second insulators, whereupon an electrical connection is established between the first and second conductors by way of the via hole.

The electrical connection can be established by a deposit of the second conductor in the via hole. Alternatively, the electrical connection can be established between the first and second conductors by way of the conductive filler that is deposited in the via hole before step (d).

Before each vapor depositing step, the substrate can be translated into position to receive the corresponding vapor deposit.

Lastly, the invention is a shadow mask vapor deposition system that includes means for vapor depositing a first conductor on a substrate; means for separately vapor depositing a pair of insulators on the first conductor, such that one of the pair of deposited insulator layers defines a slot along an edge thereof and the combination of the slot and an edge of the other of the pair of insulator layers define a via hole; and means for vapor depositing a second conductor on the pair of insulators, whereupon an electrical connection is established between the first and second conductors by way of the via hole.

The system can further include means for vapor depositing a conductive filler in the via hole.

Each means for vapor depositing a conductor can include a vacuum vessel; a deposition source disposed in the vacuum vessel and charged with the conductor to be deposited thereby; and a shadow mask disposed in the vacuum vessel and having a pattern of apertures corresponding to a desired pattern of the conductor to be deposited by the deposition source, wherein the shadow mask is positioned between the substrate and the deposition source during vapor deposition of the conductor.

The means for vapor depositing the pair of insulators can include a vacuum vessel; a deposition source disposed in the vacuum vessel and charged with the insulator to be deposited thereby; a shadow mask disposed in the vacuum vessel and having a pattern of apertures corresponding to a desired pattern of the insulator to be deposited by the deposition source, wherein the shadow mask is positioned between the substrate and the deposition source during vapor deposition of the insulator; and means for repositioning the shadow mask within the vacuum vessel between depositions of one of the pair of insulator layers and the other of the pair of insulator layers.

The means for vapor depositing the pair of insulators can include, for each insulator, a vacuum vessel; a deposition source disposed in the vacuum vessel and charged with the insulator to be deposited thereby; and a shadow mask disposed in the vacuum vessel and having a pattern of apertures corresponding to a desired pattern of the insulator to be deposited by the deposition source, wherein the shadow mask is positioned between the substrate and the deposition source during vapor deposition of the insulator.

The system can further include means for translating the substrate into each vacuum vessel to receive the vapor deposition.

At least one of the first conductor and the second conductor is formed from at least one of molybdenum, aluminum, gold, copper, nickel and titanium. At least one of the pair of insulators is formed from one of silicon dioxide, aluminum oxide and tantalum pentoxide.

DETAILED DESCRIPTION OF THE INVENTION

Figure 1A:
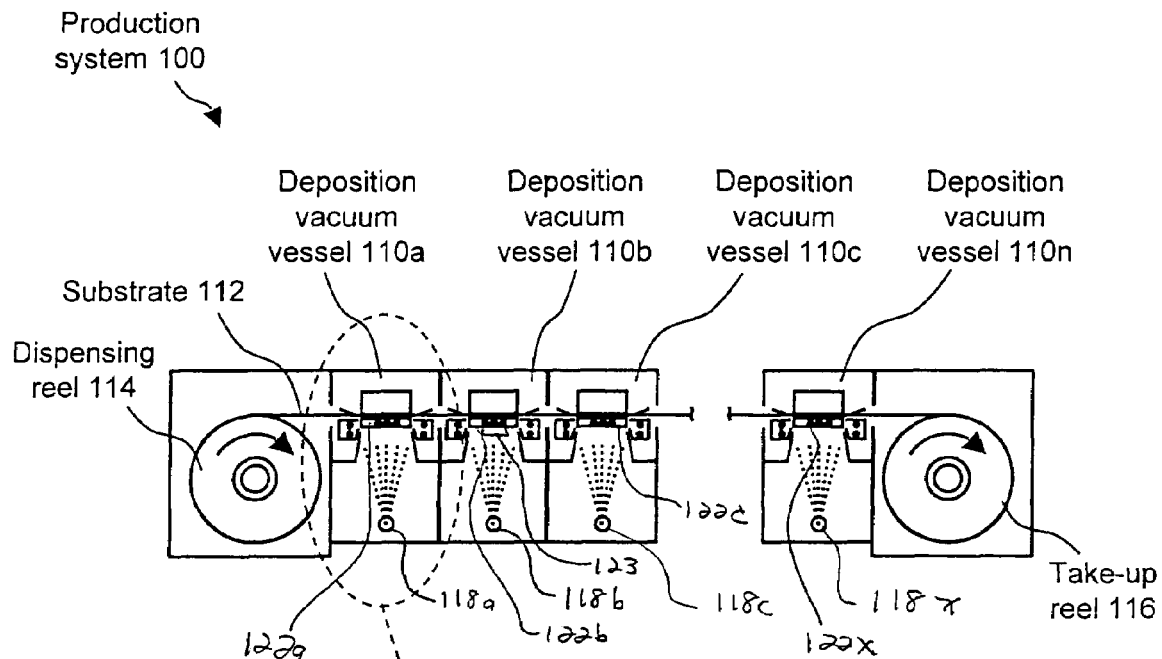
FIG. 1A is a diagrammatic illustration of a production system for forming via holes by use of multiple shadow masks in the production of a multi-layer electronic device.

With reference to FIG. 1A, a production system 100 for performing a continuous inline shadow mask deposition process to form via holes by use of multiple shadow masks in the production of a multi-layer electronic device includes a plurality of deposition vacuum vessels 110 (e.g., deposition vacuum vessels 110a through 110n). The number and arrangement of deposition vacuum vessels 110 is dependent on the number of deposition events required for any given product formed therewith.

In use of production system 100, a substrate 112 translates through deposition vacuum vessels 110 by use of a reel-to-reel mechanism that includes a dispensing reel 114 and a take-up reel 116.

Figure 1B:
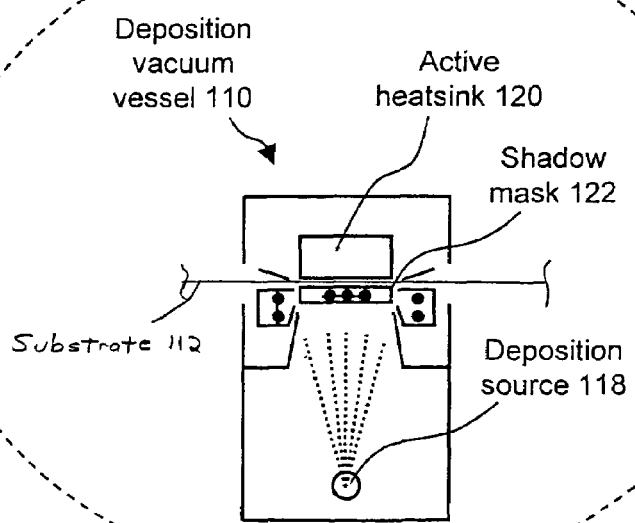
FIG. 1B is an enlarged view of a single deposition vacuum vessel of the production system of FIG. 1A.

With reference to FIG. 1B and with continuing reference to FIG. 1A, each deposition vacuum vessel 110 includes a deposition source 118, an active heatsink 120 and a shadow mask 122. For example, deposition vacuum vessel 110a includes deposition source 118a, active heatsink 120a and shadow mask 122a; deposition vacuum vessel 110b includes deposition source 118b, active heatsink 120b and shadow mask 122b; deposition vacuum vessel 110c includes deposition source 118c, active heatsink 120c and shadow mask 122c; and so forth, for any number of deposition vacuum vessels 110. If desired, one or more deposition vacuum vessels 110 can optionally include a suitable apparatus 123 for repositioning shadow mask 122 between a first position and a second position, and vice versa, within vacuum vessel 110.

Deposition vacuum vessels 110 are arranged and connected in series. Each deposition source 118 is charged with a desired material to be deposited onto substrate 112 through its associated shadow mask 122 which is held in intimate contact with the portion of substrate 112 in the corresponding deposition vacuum vessel 110.

Each active heatsink 120 provides a flat reference surface that is in contact with the non-deposition side of substrate 112 in the corresponding deposition vacuum vessel 110 and serves as a heat removal means for substrate 112 as it translates through production system 100.

Each shadow mask 122 includes a pattern of apertures (not shown), e.g., slots and holes. The pattern of apertures formed in each shadow mask 122 corresponds to a desired pattern of material to be deposited on substrate 112 from a corresponding deposition source 118 in a corresponding deposition vacuum vessel 110 as substrate 112 advances through production system 100.

Each shadow mask 122 is formed of, for example, nickel, chromium, steel, copper, Kovar® or Invar®, and has a thickness of, for example, 150–200 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that production system 100 may include additional stages (not shown), such as an anneal stage, a test stage, one or more cleaning stages, a cut and mount stage, and the like, as is well known. In addition, the number, purpose and arrangement of deposition vacuum vessels 110 can be modified, as needed, for depositing one or more materials required for a particular application by one of ordinary skill in the art. An exemplary production system 100 is disclosed in U.S. Patent Application Publication No. 2003/0228715, entitled "Active Matrix Backplane For Controlling Controlled Elements And Method Of Manufacture Thereof", which is incorporated herein by reference.

Deposition vacuum vessels 110 can be utilized for depositing materials on substrate 112 in order to form one or more electronic elements on substrate 112. Each electronic element may be, for example, a thin film transistor (TFT), a diode, a memory element, or a capacitor. A multi-layer circuit can be formed solely by successive depositions of materials on substrate 112 via successive operations in deposition vacuum vessels 110.

Each deposition vacuum vessel 110 is connected to a source of vacuum (not shown) that is operative for establishing a suitable vacuum therein in order to enable a charge of material disposed in the corresponding deposition source 118 to be deposited on substrate 112 in a manner known in the art, e.g., sputtering or vapor phase deposition, through apertures in the corresponding shadow mask 122.

In the following description, substrate 112 is described as a continuous flexible sheet, which is dispensed from dispensing reel 114 into the first deposition vacuum vessel 110. Dispensing reel 114 is positioned in a preload vacuum vessel, which is connected to a source of vacuum (not shown) operative for establishing a suitable vacuum therein. The description of substrate 112 as being a continuous flexible sheet, however, is not to be construed as limiting the invention since production system 100 can be configured to continuously process a plurality of individual or standalone substrates 112. Each deposition vacuum vessel 110 can include supports or guides that avoid substrate 112 from sagging as it is advanced therethrough.

In operation of production system 100, the material disposed in each deposition source 118 is deposited on the portion of substrate 112 positioned in the corresponding deposition vacuum vessel 110 through the corresponding shadow mask 122 in the presence of a suitable vacuum as substrate 112 is advanced through the deposition vacuum vessel 110 by the action of dispensing reel 114 and take-up reel 116, whereupon plural progressive patterns are formed on substrate 112. More specifically, substrate 112 has plural portions, each of which is positioned for a predetermined interval in each deposition vacuum vessel 110. During this predetermined interval, material is deposited from the corresponding deposition source 118 onto the portion of substrate 112 that is positioned in the corresponding deposition vacuum vessel 110. After this predetermined interval, substrate 112 is step advanced, whereupon the portion of substrate 112 is advanced to the next vacuum vessel in series for additional processing, as applicable. This step advancement continues until each portion of substrate 112 has passed through all deposition vacuum vessels 110. Thereafter, each portion of substrate 112 exiting the final deposition vacuum vessel 110 in the series is received on take-up reel 116, which is positioned in a storage vacuum vessel (not shown). Alternatively, each portion of substrate 112 exiting production system 100 is separated from the remainder of substrate 112 by a cutter (not shown).

Figure 2A:
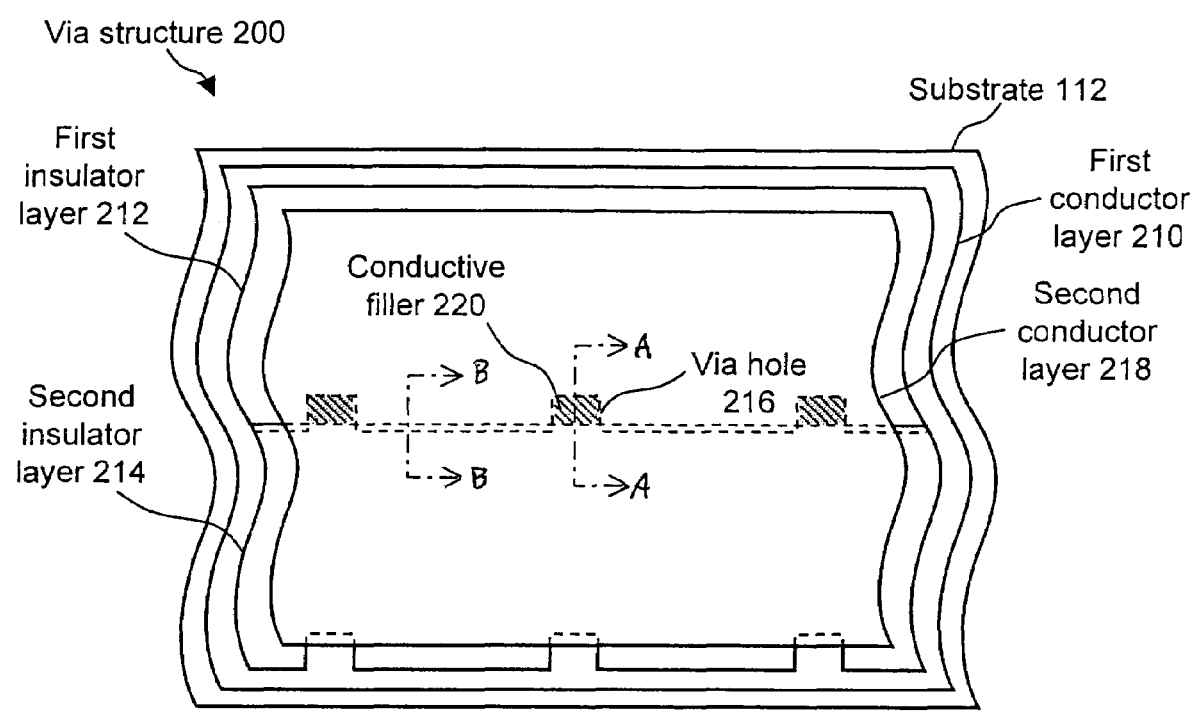
FIG. 2A is a top view of a via structure formed by multiple deposition events within the production system of FIG. 1A.

With reference to FIG. 2A, a via structure 200 can be formed by multiple deposition events within production system 100. This via structure 200 includes a first conductor layer 210 deposited atop substrate 112; a pair of insulators, e.g., first insulator layer 212 and second insulator layer 214, deposited next to each other in the same plane atop first conductor layer 210; and a second conductor layer 218 deposited atop the combination of first insulator layer 212 and second insulator layer 214. First insulator layer 212 and second insulator layer 214 are deposited so that an edge of first insulator layer 212 slightly overlaps an adjacent edge of second insulator layer 214, or vice versa. First insulator layer 212 and second insulator layer 214 are also deposited in a manner to define one or more via holes 216. Each via hole 216 is filled with a conductive filler 220 that bridges the gap between first conductor layer 210 and second conductor layer 218, thereby creating an electrical connection therebetween.

First conductor layer 210, second conductor layer 218 and conductive filler 220 are formed of one or more typical materials, e.g., metals, used to form interconnections in semiconductor fabrication. Examples of such materials include, without limitation, molybdenum, aluminum, gold, copper, nickel, titanium, metal alloys, and other metal compounds. The combination of first insulator layer 212 and second insulator layer 214 creates a non-conductive layer that is formed of any common circuit insulator material, such as, without limitation, silicon dioxide ($SiO_2$), aluminum oxide ($Al_2O_3$) or tantalum pentoxide ($Ta_2O_5$).

Figure 2B:
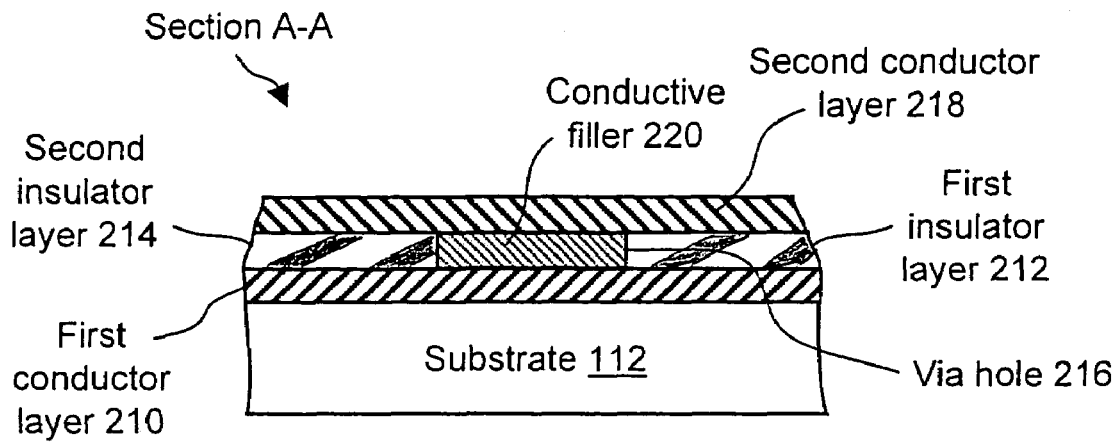
FIG. 2B is a cross section taken along line A—A in FIG. 2A.

With reference to FIG. 2B and with continuing reference to FIG. 2A, each via hole 216 of via structure 200 includes conductive filler 220 that is deposited in one deposition vacuum vessel 110 of production system 100. In this way, an electrical connection is formed between first conductor layer 210 and second conductor layer 218 when second conductor layer 218 is deposited. Outside the region defined by via hole 216, first conductor layer 210 and second conductor layer 218 are isolated electrically by either first insulator layer 212 or second insulator layer 214.

Figure 2C:
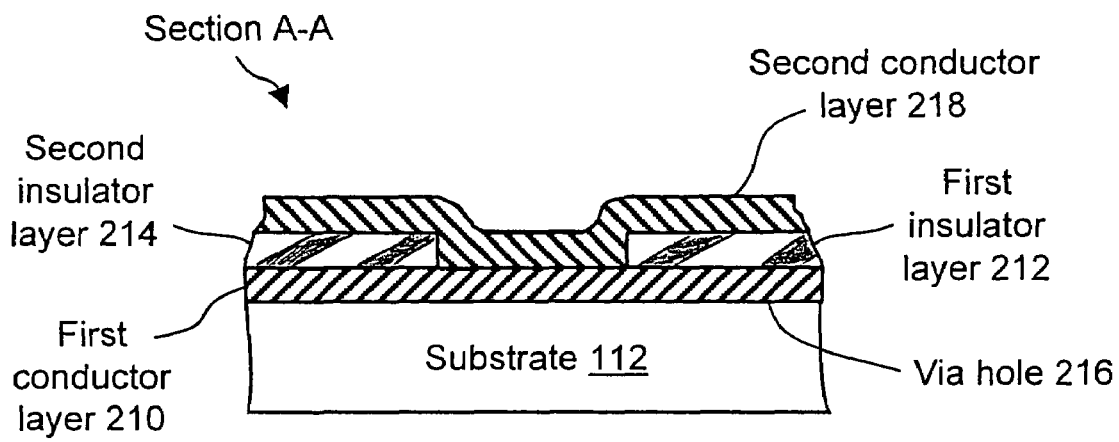
FIG. 2C is a cross section taken along line A—A in FIG. 2A in an alternative embodiment of the invention.

With reference to FIG. 2C and with continuing reference to FIG. 2A, instead of conductive filler 220 being deposited within via hole 216, second conductor layer 218 can be deposited atop first insulator layer 212, second insulator layer 214 and in via hole 216, thereby making direct contact with an exposed surface of first conductor layer 210 in via hole 216.

Figure 2D:
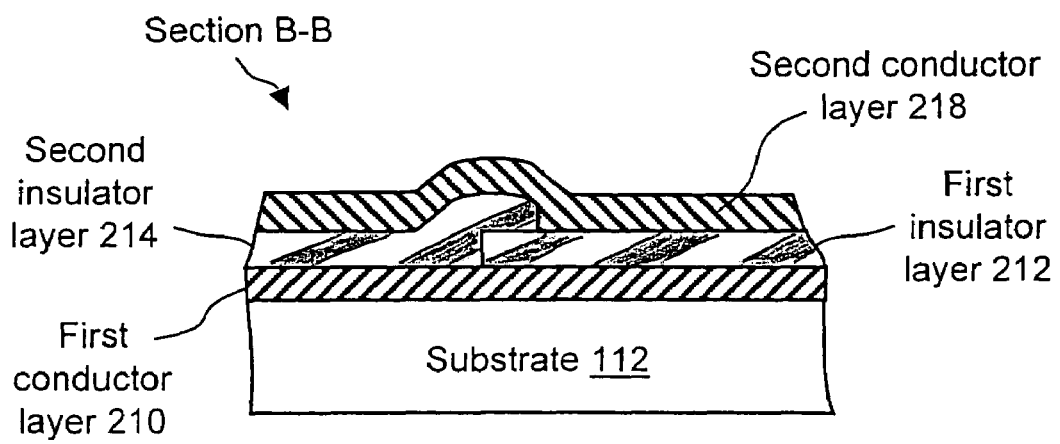
FIG. 2D is a cross-section taken along line B—B in FIG. 2A.

With reference to FIG. 2D and with continuing reference to FIG. 2A, alternatively, second insulator layer 214 can partially overlap first insulator layer 212 when first and second insulator layers 212 and 214 are deposited on first conductor layer 210 and with second conductor layer 218 deposited on first and second insulator layers 212 and 214. Other conductive or non-conductive layers of material may exist upon substrate 112 but, for simplicity, are not shown in FIGS. 2A through 2D.

The formation of via structure 200 will now be described in greater detail.

Figure 3A:
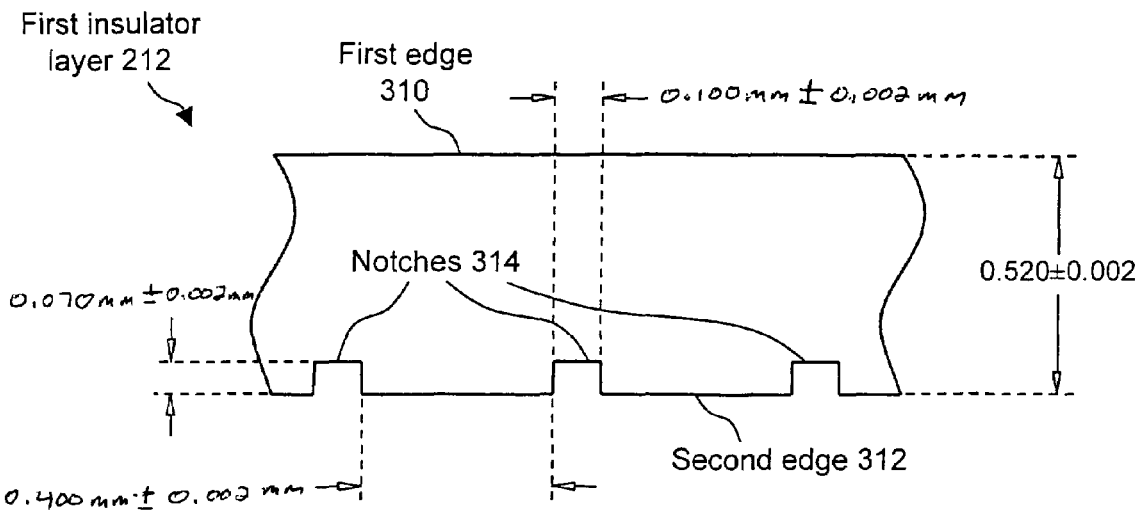
FIGS. 3A and 3B are top views of a first insulator layer and a second insulator layer, respectively, deposited by the production system of FIG. 1A.
Figure 3B:
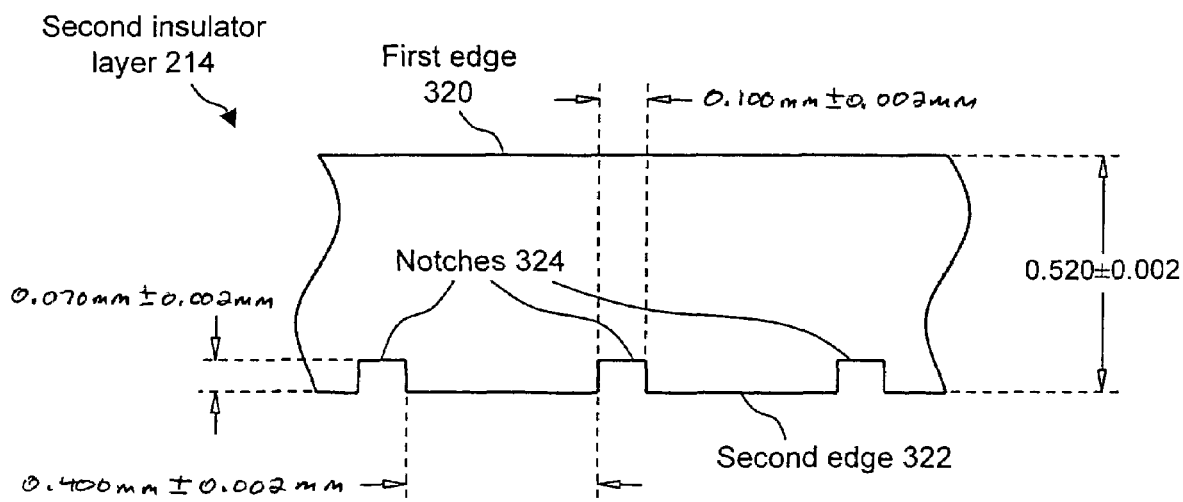

With reference to FIGS. 3A and 3B, first insulator layer 212 includes a first edge 310, a second edge 312 and one or more notches or slots 314 formed along second edge 312 at predetermined locations. Second insulator layer 214 includes a first edge 320, a second edge 322 and one or more notches or slots 324 formed along second edge 322 at predetermined locations. Exemplary dimensions of first insulator layer 212 and second insulator 214 are shown for the purpose of illustration but are not to be construed as limiting the invention.

Figure 3C:
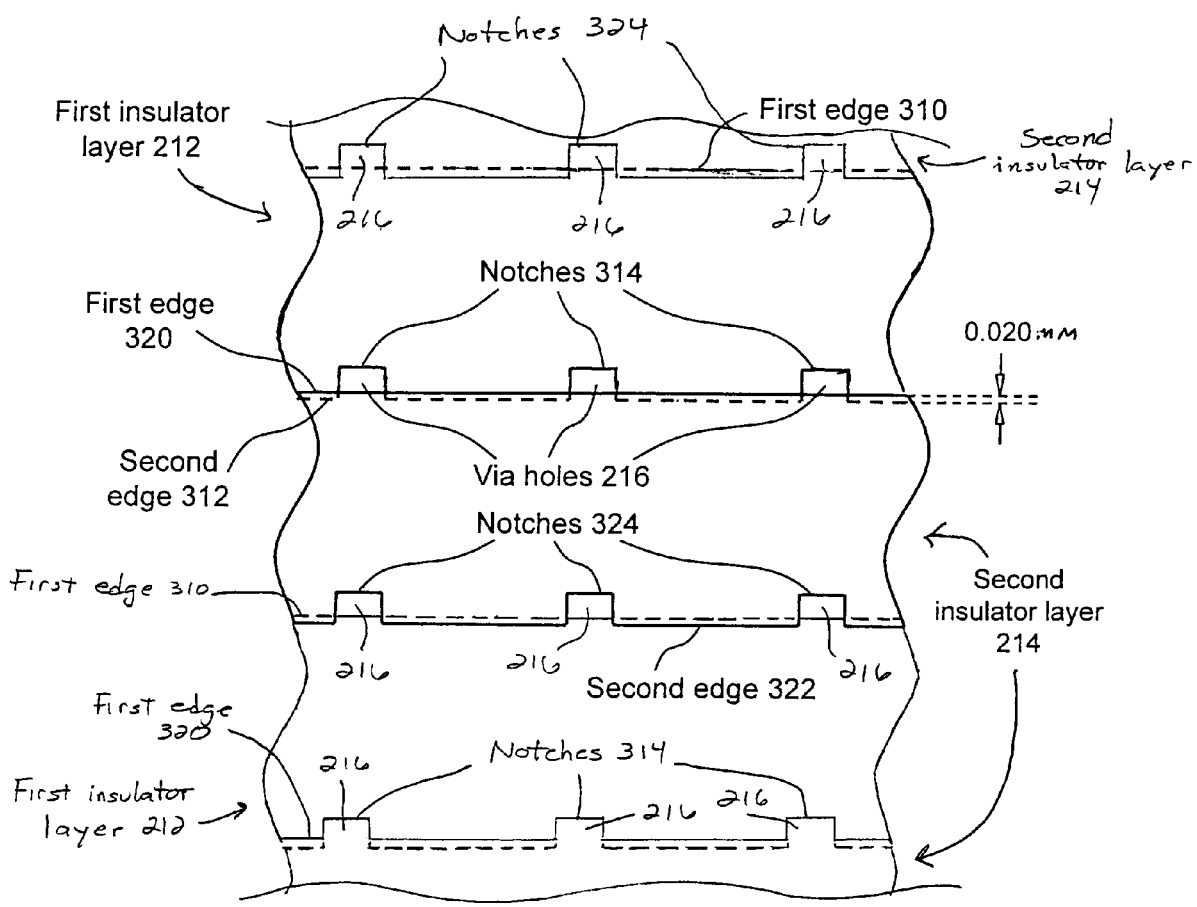
FIG. 3C is a top view of first insulator layers and second insulator layers deposited in an overlapping manner by the production system of FIG. 1A to form via hole(s)

With reference to FIG. 3C, where one or more first insulator layers 212 are deposited before one or more second insulator layers 214, first edge 320 of each second insulator layer 214 slightly overlaps second edge 312 of the neighboring first insulator layer 212 by a distance that is significantly less than the depth of notches 314, for example, an overlap distance of 0.020 mm for a notch 314 depth of 0.070 mm. Similarly, second edge 322 of second insulator layer 214 slightly overlaps first edge 310 of the neighboring first insulator layer 212 by a distance that is significantly less than the depth of notches 324, for example, an overlap distance of 0.020 mm for a notch 324 depth of 0.070 mm. In this way, the boundary of each via hole 216 is formed either by three sides or walls of one notch 314 of first insulator layer 212 and on a fourth side or wall by first edge 320 of the neighboring second insulator layer 214 or by three sides or walls of one notch 324 of second insulator layer 214 and on a fourth side or wall by first edge 310 of the neighboring first insulator layer 212. Each via hole 216 is, therefore, representative of an opening (i.e., an absence of insulating material) within the combination of first insulator layer 212 and second insulator layer 214. An array of via holes 216 formed in a like manner by an arrangement of multiple first insulator layers 212 and multiple second insulator layers 214 is illustrated in greater detail in FIG. 4.

Figure 4:
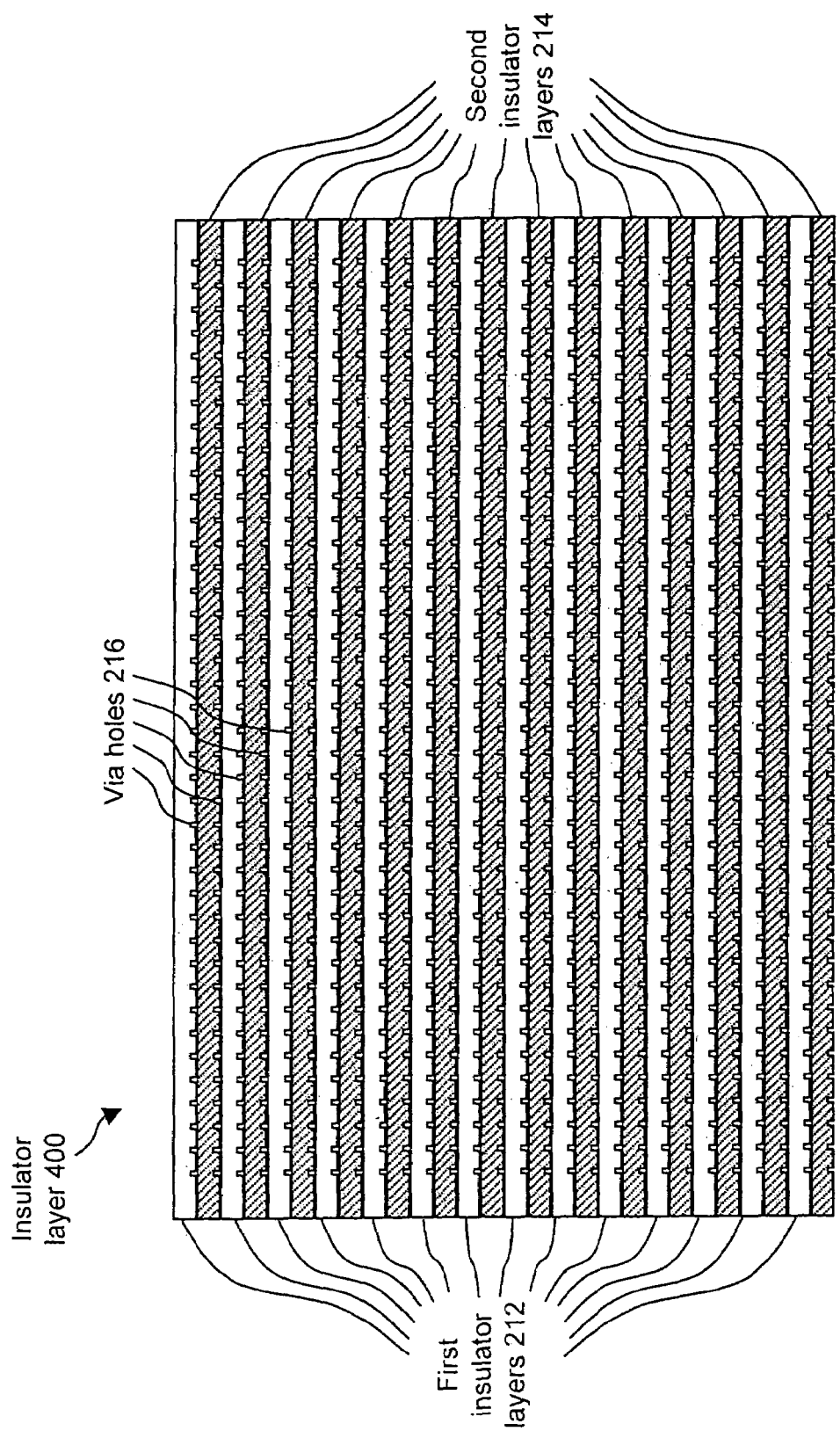
FIG. 4 is a top view of first and second insulator layers that includes an array of via holes formed by the production system of FIG. 1A.

In FIG. 4, an insulator layer 400 is formed, for example, by depositing a plurality of spaced parallel first insulator layers 212 atop first conductor layer 210 (not shown in FIG. 4) and, thereafter, depositing a plurality of spaced parallel second insulator layers 214 also atop first conductor layer 210 (not shown in FIG. 4). The second insulator layers 214 are deposited relative to the first insulator layers 212 such that the first and second edges 320 and 322 of each second insulator layer 214 slightly overlap the respective second and first edges 312 and 310 of the neighboring first insulator layers 212. In this way, a continuous layer of insulating material is formed having an array of via holes 216 therein. Insulator layer 400, with its array of via holes 216 is exemplary only and is not to be construed as limiting the invention.

Figure 5A:
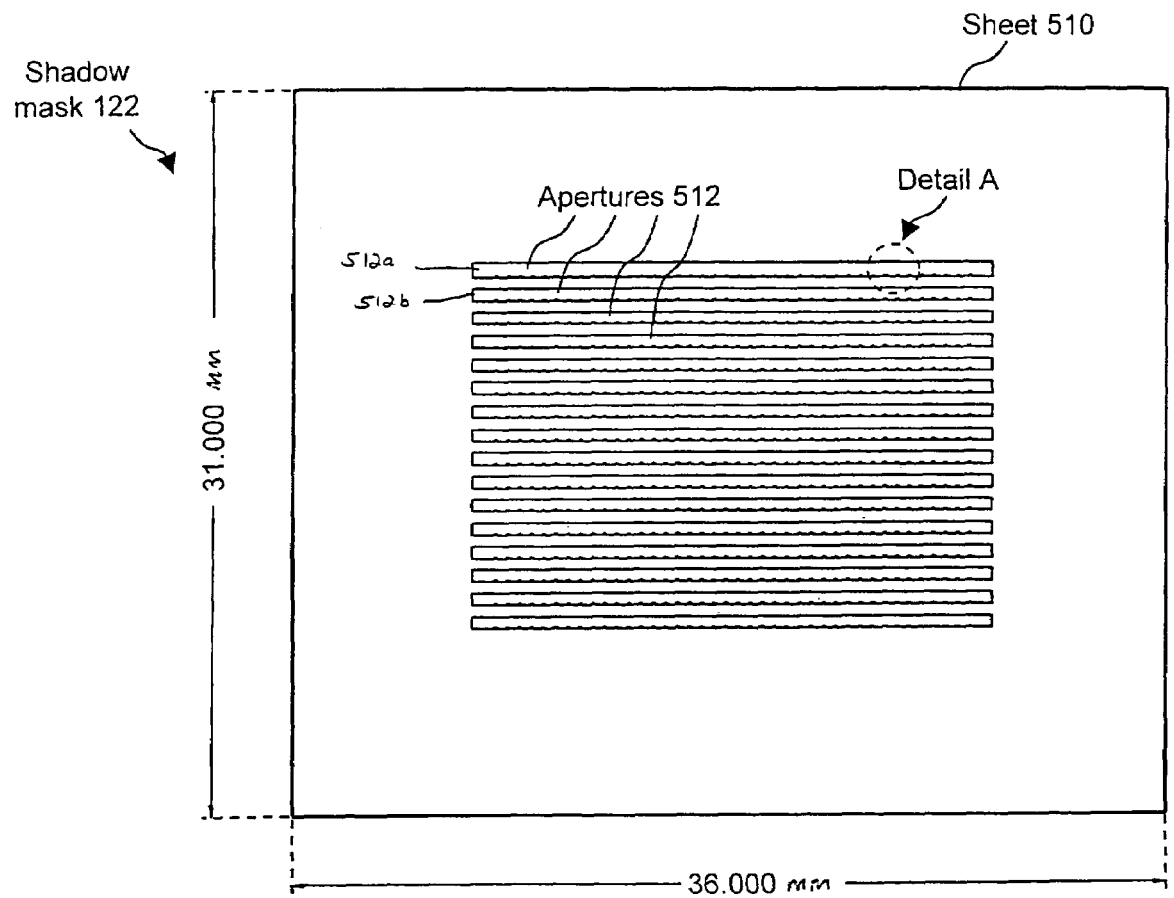
FIG. 5A is a top view of an exemplary shadow mask for use in the production system of FIG. 1A for forming a set of insulator layers.

With reference to FIG. 5A, a shadow mask 122 for forming a first set of insulator layers, such as first insulator layers 212 shown in FIG. 4, includes a sheet 510 that has a plurality of apertures 512, e.g., apertures 512a, 512b, 512c, etc., formed therein. Each aperture 512 is an opening of predetermined size, shape, and location, according to an associated circuit layout. Sheet 510 is formed of, for example, nickel, chromium, steel, copper, Kovar® or Invar® and has a thickness of, for example, 0.070 mm.

Figure 5B:
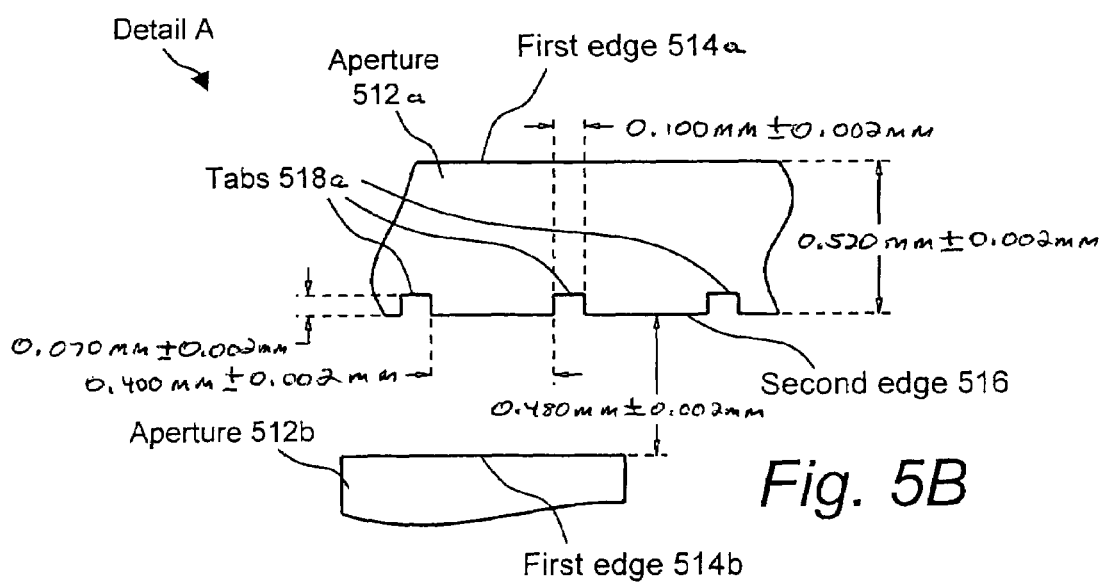
FIG. 5B is a detailed top view of Detail A of FIG. 5A.

With reference to FIG. 5B which shows Detail A of FIG. 5A, each aperture 512 includes a first edge 514, a second edge 516 and a set of tabs 518 formed along second edge 516 at predetermined locations. Exemplary dimensions of aperture 512 are shown for the purpose of illustration but are not to be construed as limiting the invention.

Another shadow mask (not shown), like shadow mask 122 in FIG. 5A but with its apertures offset relative to apertures 512 of shadow mask 122 in FIG. 5A, can be provided for forming a second set of insulator layers, such as second insulator layers 214 shown in FIG. 4.

With reference to FIGS. 1 through 5B, in operation of production system 100, first conductor layer 210 is deposited atop substrate 112 by way of shadow mask 122a within deposition vacuum vessel 110a. Subsequently, first insulator layer 212 is deposited atop first conductor layer 210 by way of shadow mask 122b within deposition vacuum vessel 110b and second insulator layer 214 is deposited atop first conductor layer 210 by way of shadow mask 122c within deposition vacuum vessel 110c, thereby forming one or more via holes 216. Subsequently, conductive filler 220 is deposited within each via hole 216 within deposition vacuum vessel 110d by way of shadow mask 122d that has an aperture pattern that matches the layout of via holes 216. Second conductor layer 218 is then deposited atop the combination of first insulator layer 212, second insulator layer 214 and conductive filler 220 by way of shadow mask 122e within deposition vacuum vessel 110e. Alternatively, instead of conductive filler 220 being deposited within via holes 216, second conductor layer 218 is deposited atop first insulator layer 212 and second insulator layer 214 and follows the contour of each via hole 216 in order to make the electrical connection to first conductor layer 210. First conductor layer 210 and second conductor layer 218 can each be deposited in a predetermined pattern to form a desired circuit pattern. For example, first conductor layer 210 can be deposited as a series of spaced parallel lines that extend in a first direction on substrate 112 while second conductor layer 218 can be deposited as a series of spaced parallel lines extending in a direction perpendicular to the spaced parallel lines of first conductor layer 210. A via hole 216 can be formed in the above-described manner at the intersection of each spaced parallel line of the first conductor layer 210 and each spaced parallel line of the second conductor layer 218.

Figure 6:
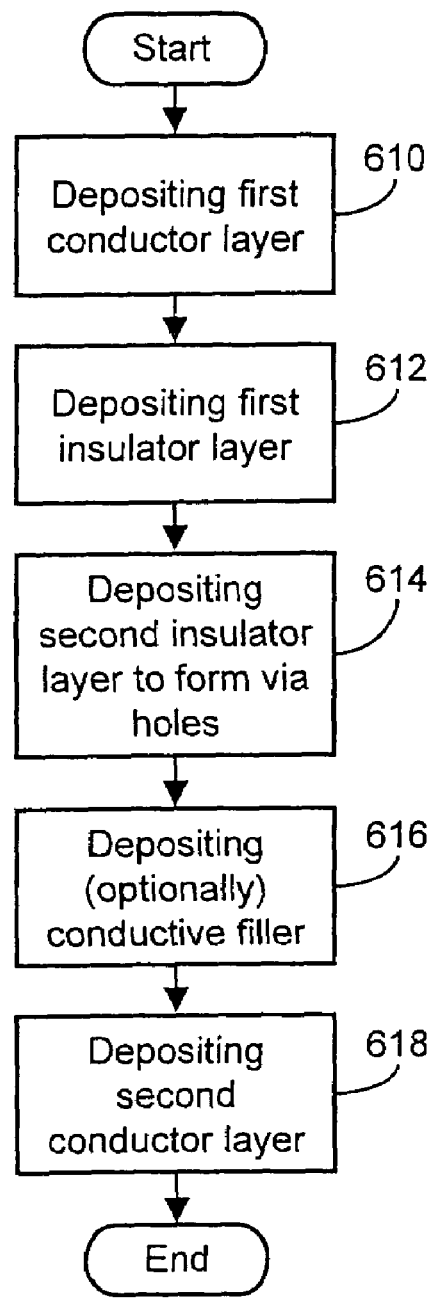
FIG. 6 is a flow diagram of a method of making a via structure by use of the production system of FIG. 1A.

With reference to FIG. 6, a method 600 of making via structure 200 includes step 610 wherein substrate 112 is advanced into, for example, deposition vacuum vessel 110a by the reel-to-reel system formed by dispensing reel 114 and take-up reel 116. Shadow mask 122a is then aligned and brought into intimate contact with substrate 112 and a first conductive layer, such as first conductor layer 210, is deposited on substrate 112 by deposition source 118a through the aperture pattern of shadow mask 122a, which has an aperture pattern matching the layout of first conductor layer 210.

The method then advances to step 612, wherein substrate 112 is advanced into, for example, deposition vacuum vessel 110b by the reel-to-reel system. Shadow mask 122b is then aligned and brought into intimate contact with substrate 112 and a first insulator layer, such as first insulator layer 212 shown in FIG. 3C, is deposited on one or more portions of first conductor layer 210 by deposition source 118b through the aperture pattern of shadow mask 122b, which has an aperture pattern matching the layout of first insulator layer 212, such as is shown in FIGS. 5A and 5B.

The method then advances to step 614, wherein substrate 112 is advanced into, for example, deposition vacuum vessel 110c by the reel-to-reel system. Shadow mask 122c is then aligned and brought into intimate contact with substrate 112 and a second insulator layer, such as second insulator layer 214 shown in FIG. 3C, is deposited on one or more other portions of first conductor layer 210 by deposition source 118c through the aperture pattern of shadow mask 122c, which has an aperture pattern matching the layout of second insulator layer 214. Second insulator layer 214 is deposited such that it slightly overlaps first insulator layer 212, as shown in FIGS. 3C and 4, thereby forming a set of via holes 216, as shown in FIGS. 2A, 3C and 4.

The method then advances to optional step 616, wherein substrate 112 is advanced into, for example, deposition vacuum vessel 110d by the reel-to-reel system. Shadow mask 122d is then aligned and brought into intimate contact with substrate 112 and conductive filler, such as conductive filler 220, is deposited within each via hole 216, as shown in FIGS. 2A and 2B, by deposition source 118d through the aperture pattern of shadow mask 122d, which has an aperture pattern that matches the layout of via holes 216.

The method then advances to step 618, wherein substrate 112 is advanced into, for example, deposition vacuum vessel 110e of production system 100 by the reel-to-reel system. Shadow mask 122e is then aligned and brought into intimate contact with first insulator layer 212 and second insulator layer 214. A second conductive layer, such as second conductor layer 218, is then deposited upon first insulator layer 212, second insulator layer 214 and, if provided, conductive filler 220 by deposition source 118e through the aperture pattern of shadow mask 122e, which has an aperture pattern that matches the layout of second conductor layer 218.

In method 600, steps 612 and 614 may be interchanged. To this end, first conductor layer 210 and second conductor layer 218 may be deposited in any order. Furthermore, while FIGS. 2A through 6 describe forming one or more via holes 216 in an insulator layer by use of two deposition events, i.e., depositing first insulator layer 212 and second insulator layer 214, those skilled in the art will appreciate that while at least two deposition events are required, more than two deposition events may be employed depending on the design of the shadow masks 122 for forming the via holes 216 between first conductor layer 210 and second conductor layer 218. Therefore, the present invention is not to be construed as limited to forming via holes 216 by way of only two deposition events.

In summary, production system 100 and method 600 of the present invention provide a way of forming one or more via holes 216 by multiple successive deposition events within deposition vacuum vessels 110. In one embodiment, an insulator layer is formed between first conductor layer 210 and second conductor layer 218 by depositing first insulator layer 212 and then depositing second insulator layer 214, wherein the edge of first insulator layer 212 (or second insulator layer 214) includes a set of notches 314 (or 324), i.e., that represent an absence of insulating material, and wherein first edge 320 of second insulator layer 214 (or first edge 310 of first insulator layer 212) slightly overlaps notches 314 of first insulator layer 212 (or notches 324 of second insulator layer 214). In this way, boundaries are established to form one or more via holes 216. For example, the boundaries of each via hole 216 are established on three sides by a notch 314 of first insulator layer 212 (or notch 324 of second insulator layer 214) and on a fourth side by first edge 320 of second insulator layer 214 (or first edge 310 of first insulator layer 212). As a result, an opening is formed within the combination of first insulator layer 212 and second insulator layer 214 that may provide a conductive path through said combination for electrically connecting the first conductor layer 210 and second conductor layer 218.

The use of multiple deposition events to form an insulator layer that has one or more via holes 216 by use of production system 100 and method 600 of the present invention avoids the interruption of the process flow to form via holes using other processes, such as a photolithography process which is a subtractive wet chemical process that is expensive, inefficient and not easily integrated into a continuous inline shadow mask deposition process.

Furthermore, production system 100 and method 600 of the present invention are not to be construed as limited to forming a "hole", i.e., region where material is absent, in an insulator layer. The concepts and techniques disclosed herein are applicable to forming a hole in a layer of any material, such as an insulator layer, conductor layer, or semiconductor layer.

The present invention has been described with reference to the preferred embodiment. Obvious combinations and alterations will occur to others upon reading and understanding the foregoing detailed description. For example, one or more first insulator layers 212 can include one or more notches 314 along each of first edge 310 and second edge 320 thereof, while first edge 320 and second edge 322 of each neighboring second insulator layer 214 can be devoid of notches or slots. To this end, the position of one or more notches on the first edge and/or the second edge of each insulator layer can be selected as desired and is, therefore, not to be construed as limiting the invention. Moreover, while first and second insulator layers 212 and 214 were described as being deposited by way of separate shadow masks 122 in separate deposition vacuum vessels 110, if the first and second insulator layers 212 and 214 have the same pattern, as shown in FIG. 3C, the same shadow mask can be utilized to deposit both insulator layers simply by having optional apparatus 123 repositioning the shadow mask in the deposition vacuum vessel between deposition events. For example, after depositing a first insulator layer 212, by way of a shadow mask 122, said shadow mask 122 can be shifted or repositioned whereupon the second insulator layer can be deposited in the same deposition vacuum vessel by way of the same shadow mask in the manner shown in FIG. 3C. Moreover, the various dimensions described herein are exemplary and are not to be construed as limiting the invention since the use of other suitable dimensions is/are envisioned. It is intended that the invention be construed as including all such modifications and alterations insofar as they come within the scope of the appended claims or the equivalents thereof.

The invention claimed is:

1. A shadow mask vapor deposition method comprising:
    (a) vapor depositing a first conductor layer on a substrate;
    (b) separately vapor depositing a pair of insulator layers on the first conductor layer, wherein one of the pair of deposited insulator layers defines a slot along an edge thereof and the combination of the slot and an edge of the other of the pair of deposited insulator layers define a via hole; and
    (c) vapor depositing a second conductor layer on the first and second insulator layers, wherein the first and second conductor layers are electrically connected by way of an electrical conductor in the via hole.

2. The method of claim 1, wherein the second conductor layer forms the electrical conductor.

3. The method of claim 1, further including, between steps (b) and (c), vapor depositing the electrical conductor in the via hole.

4. The method of claim 1, wherein each conductor layer and each insulator layer is deposited by way of a different shadow mask.

5. The method of claim 4, further including, before vapor depositing each layer, advancing the substrate into operative relation with the corresponding shadow mask.

6. The method of claim 1, wherein:
each conductor layer is deposited by way of a different shadow mask; and
each insulator layer is deposited by way of the same shadow mask that is repositioned between depositions of one of the pair of insulator layers and the other of the pair of insulator layers.

7. The method of claim 1, wherein:
the first and second conductor layers are formed from the same conductive material; and
the first and second insulator layers are formed from the same insulating material.

8. A shadow mask vapor deposition method comprising:
(a) vapor depositing a first conductor on a substrate;
(b) vapor depositing a first insulator on the first conductor;
(c) vapor depositing a second insulator on the first conductor, whereupon at least one via hole is defined solely by the vapor depositions of said first and second insulators; and
(d) vapor depositing a second conductor on the first and second insulators, whereupon an electrical connection is established between the first and second conductors by way of the via hole.

9. The method of claim 8, wherein the electrical connection is established by a deposit of the second conductor in the via hole.

10. The method of claim 8, further including, before step (d), vapor depositing a conductive filler in the via hole such that, when the second conductor is deposited, the electrical connection is established between the first and second conductors by way of the conductive filler in the via hole.

11. The method of claim 8, further including, before each vapor depositing step, translating the substrate into position to receive the corresponding vapor deposit.

12. The method of claim 8, wherein:
the first and second conductors are formed from the same conductive material; and
the first and second insulators are formed from the same insulating material.

* * * * *